(12) United States Patent
Schubert et al.

(10) Patent No.: US 9,843,160 B1
(45) Date of Patent: Dec. 12, 2017

(54) INTEGRATED DIGITAL LASER

(71) Applicant: X Development LLC, Mountain View, CA (US)

(72) Inventors: Martin Friedrich Schubert, Mountain View, CA (US); Michael Jason Grundmann, San Jose, CA (US)

(73) Assignee: X Development LLC, Mountain View, CA (US)

( * ) Notice: Subject to any disclaimer, the term of this patent is extended or adjusted under 35 U.S.C. 154(b) by 0 days.

(21) Appl. No.: 15/394,164

(22) Filed: Dec. 29, 2016

(51) Int. Cl.
| | |
|---|---|
| *H01S 5/00* | (2006.01) |
| *H01S 5/183* | (2006.01) |
| *H01S 5/125* | (2006.01) |
| *H01S 5/343* | (2006.01) |
| *H01S 5/042* | (2006.01) |
| *H01S 5/026* | (2006.01) |
| *H01S 5/0625* | (2006.01) |
| *H01S 5/0683* | (2006.01) |
| *H01S 5/068* | (2006.01) |
| *H01S 5/30* | (2006.01) |

(52) U.S. Cl.
CPC ........ *H01S 5/18302* (2013.01); *H01S 5/0265* (2013.01); *H01S 5/0425* (2013.01); *H01S 5/068* (2013.01); *H01S 5/06251* (2013.01); *H01S 5/06832* (2013.01); *H01S 5/125* (2013.01); *H01S 5/34313* (2013.01); *H01S 5/042* (2013.01); *H01S 5/30* (2013.01)

(58) Field of Classification Search
CPC .............. H01S 5/18302; H01S 5/0265; H01S 5/06251; H01S 5/06832; H01S 5/30; H01S 5/042; H01S 5/068; H01S 5/0425; H01S 5/125; H01S 5/34313
See application file for complete search history.

(56) References Cited

U.S. PATENT DOCUMENTS

| | | | | |
|---|---|---|---|---|
| 2010/0020291 A1* | 1/2010 | Kasazumi | ............ | G02B 17/004 353/38 |
| 2016/0064894 A1* | 3/2016 | Takiguchi | ......... | G02F 1/133615 372/26 |
| 2016/0380405 A1* | 12/2016 | Takiguchi | ........... | H01S 5/34353 372/26 |

OTHER PUBLICATIONS

Ngcobo et al. "A digital laser for on-demand laser modes," Nature Communications, Aug. 2, 2013, 6 pages.

* cited by examiner

*Primary Examiner* — Kinam Park
(74) *Attorney, Agent, or Firm* — Fish & Richardson P.C.

(57) ABSTRACT

A laser device includes: a substrate formed from material transparent at a laser wavelength; a first reflecting layer to reflect at least some incident radiation at the laser wavelength; a layer including a gain medium for providing stimulated emission of radiation at the laser wavelength, and positioned between the first reflecting layer and the substrate; a second reflecting layer on an opposite side of the substrate from the first reflecting layer to reflect at least some incident radiation at the laser wavelength; a spatial light modulator in an optical cavity comprising the first and second reflecting layers, and comprising an array of elements each corresponding to a different path for radiation in the optical cavity; and a computer controller that, during operation, causes the spatial light modulator to selectively vary an intensity or phase of radiation in the optical cavity to provide variable transverse spatial mode output of the radiation.

27 Claims, 6 Drawing Sheets

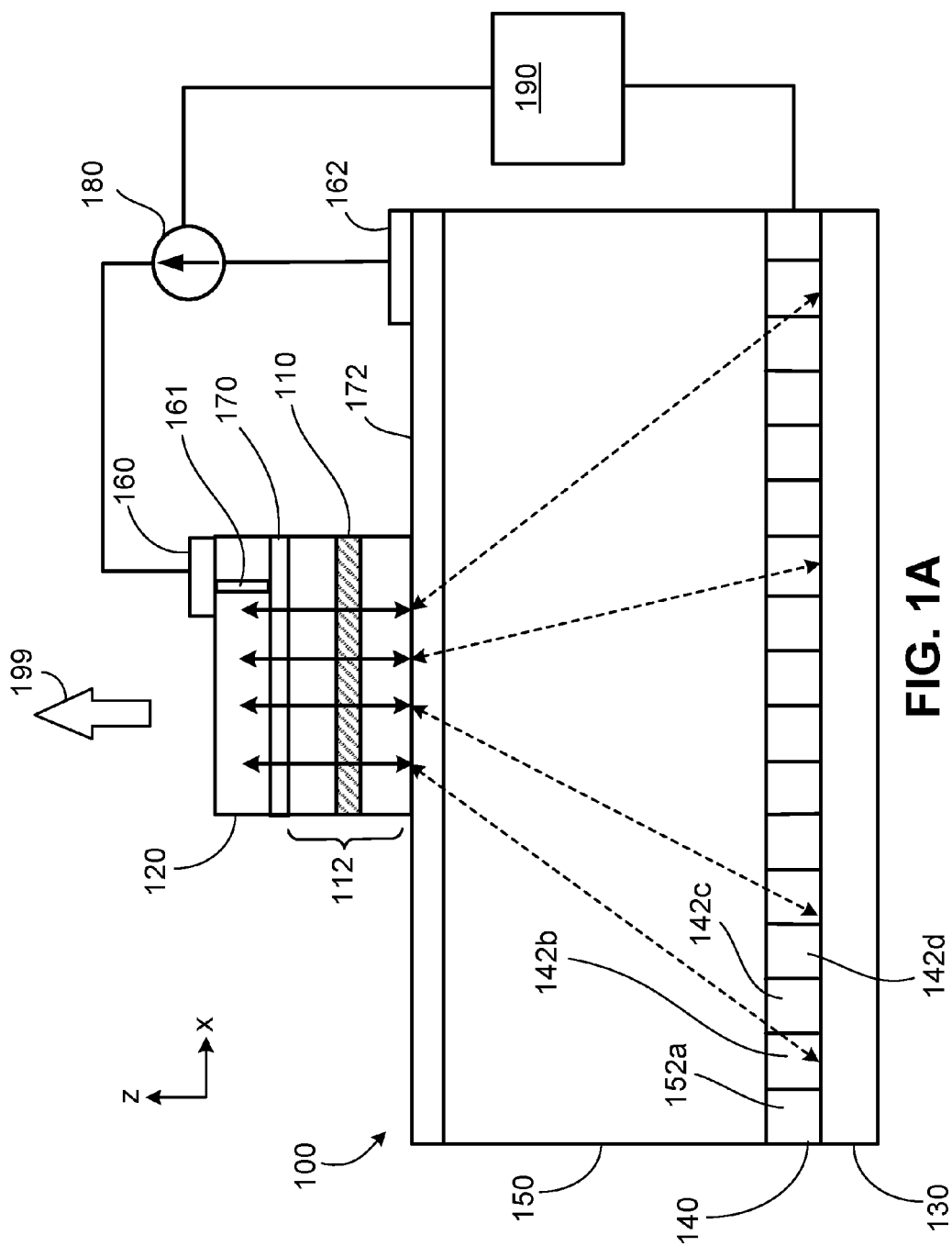

INTEGRATED DIGITAL LASER

TECHNICAL FIELD

This disclosure generally relates to integrated laser devices and methods of making the integrated laser devices.

BACKGROUND

In general, laser beams can be shaped by directing the output of a laser through one or more beam shaping optics, such as diffractive optical elements, lenses, mirrors, prisms and the like. Depending on the specific laser beam profile desired, the effect of the shaping can include homogenizing the beam's intensity across the beam's width, or ensuring a particular cross-sectional shape to the beam (e.g., circular, rectangular, elliptical) and/or ensuring a particular beam intensity profile within the beam's cross-section. Laser beams can also be actively shaped, e.g., using spatial light modulators (SLMs). For example, a reflective or transparent SLM, composed of an array of elements whose reflective or transmissive properties are independently variable, can be positioned in the path of the laser beam and operated to variably change the beam profile by control of the SLM. In many cases, the beam shaping optics are positioned outside of the optical cavity of the laser.

SUMMARY

This disclosure features architectures for an integrated laser device capable of producing variable transverse spatial mode output in a programmable manner. In certain implementations, the devices incorporate a digitally-addressable spatial light modulator (SLM) within the laser's optical cavity. The SLM allows one to spatially vary the radiation loss and/or phase across the optical cavity and, correspondingly, vary the intensity profile of the laser output. The number of unique transverse spatial modes attainable using the disclosed laser devices is limited only by the size, resolution, and grayscale levels of the SLM array.

In general, in a first aspect, the invention features a laser device with variable transverse spatial mode output, including: a substrate formed from a material transparent at a laser wavelength; a first reflecting layer supported by the substrate, the first reflecting layer being configured to reflect at least some incident radiation at the laser wavelength; a layer including a gain medium for providing stimulated emission of radiation at the laser wavelength, the layer comprising the gain medium being positioned between the first reflecting layer and the substrate; a second reflecting layer supported by the substrate on an opposite side of the substrate from the first reflecting layer, the second reflecting layer being configured to reflect at least some incident radiation at the laser wavelength; a spatial light modulator supported by the substrate and positioned in a path of radiation in an optical cavity comprising by the first and second reflecting layers, the spatial light modulator comprising an array of elements each corresponding to a different path for radiation in the optical cavity; and a computer controller in communication with the spatial light modulator. During operation the computer controller causes the spatial light modulator to selectively vary an intensity or phase of radiation in each of the radiation paths in the optical cavity to provide variable transverse spatial mode output of the radiation from the laser device.

Embodiments of the laser device can include one or more of the following features. For example, the spatial light modulator can be on the opposite side of the substrate as the layer comprising the gain medium. The spatial light modulator can be a transmissive spatial light modulator.

The spatial light modulator can be on the same side of the substrate as the layer comprising the gain medium. The spatial light modulator can be a reflective spatial light modulator. The second reflecting layer can be arranged to reflect incident radiation emitted by the gain medium toward the spatial light modulator and to reflect incident radiation reflected by the spatial light modulator toward the gain medium.

In some embodiments, the first reflecting layer includes a Bragg reflector for radiation at the laser wavelength.

The second reflecting layer can include a reflective grating, such as a chirped reflective grating.

The gain medium can include a quantum well layer.

The laser device can include a first electrode layer between the layer comprising the gain medium and the substrate. In some embodiments, the laser device can further include a second electrode layer, the first and second electrode layers being on opposing sides of the layer comprising the gain medium. One or both of the first and second electrode layers can be patterned electrode layers. The first electrode layer can be formed from an electrically-conductive material transparent at the laser wavelength. The first electrode layer can include an aperture for the passage of laser radiation. The first or second reflecting layer can be a partial reflecting layer for radiation at the laser wavelength.

The laser wavelength can be in a range from 250 nm to 5,000 nm.

During operation, the gain medium can be electrically-pumped, optically-pumped, or pumped using an electron beam.

The laser device can be part of a display or an optical communication system.

In general, in a further aspect, the invention features a method of forming a laser device, including: forming a light emitting module including a first reflecting layer and a layer that includes a gain medium, the first reflecting layer being configured to reflect at least some incident radiation at a laser wavelength and the layer that includes the gain medium being configured to provide stimulated emission of radiation at the laser wavelength; forming a spatial light modulator; and assembling the laser device by attaching the light emitting module and spatial light modulator to a common substrate layer formed from a material transparent at the laser wavelength such that the spatial light modulator is positioned in a path of radiation in an optical cavity defined by the first reflecting layer and a second reflector, the spatial light modulator including an array of elements each corresponding to a different path for radiation through the substrate layer in the optical cavity.

Implementations of the method can include one or more of the following features and/or features of other aspects. For example, forming the light emitting module can include sequentially forming multiple layers on top of each other and patterning at least some of the layers.

Forming the laser device can include forming multiple devices using a common substrate and dicing the substrate to provide multiple individual devices.

The spatial light modulator can include the second reflector.

The second reflector can be a second reflector layer and the spatial light modulator can be a transmissive spatial light modulator and a path of the laser radiation between the first and second reflecting layers.

The spatial light modulator and light emitting module can be disposed on opposing sides of the common substrate.

The spatial light modulator and light emitting module can be disposed on the same side of the common substrate and an additional reflector is disposed on the opposite side of the substrate and arranged to direct light from the light emitting module to the spatial light modulator and vice versa.

Among other advantages, implementations of the integrated laser devices can provide compact, robust light emitting devices that provide programmable spatially varying output profiles.

Advantageously, the disclosed device architectures are achievable using wafer processing techniques, enabling compact, integrated form-factors and large-scale manufacturing in an economic manner.

The details of one or more implementations of the subject matter of this disclosure are set forth in the accompanying drawings and the description below. Other features, aspects, and advantages of the subject matter will become apparent from the description, the drawings, and the claims.

BRIEF DESCRIPTION OF THE DRAWINGS

FIG. 1A shows a cross-sectional view of an embodiment of an integrated laser device;

Like reference numbers and designations in the various drawings indicate like elements.

DETAILED DESCRIPTION

Figure 1B:
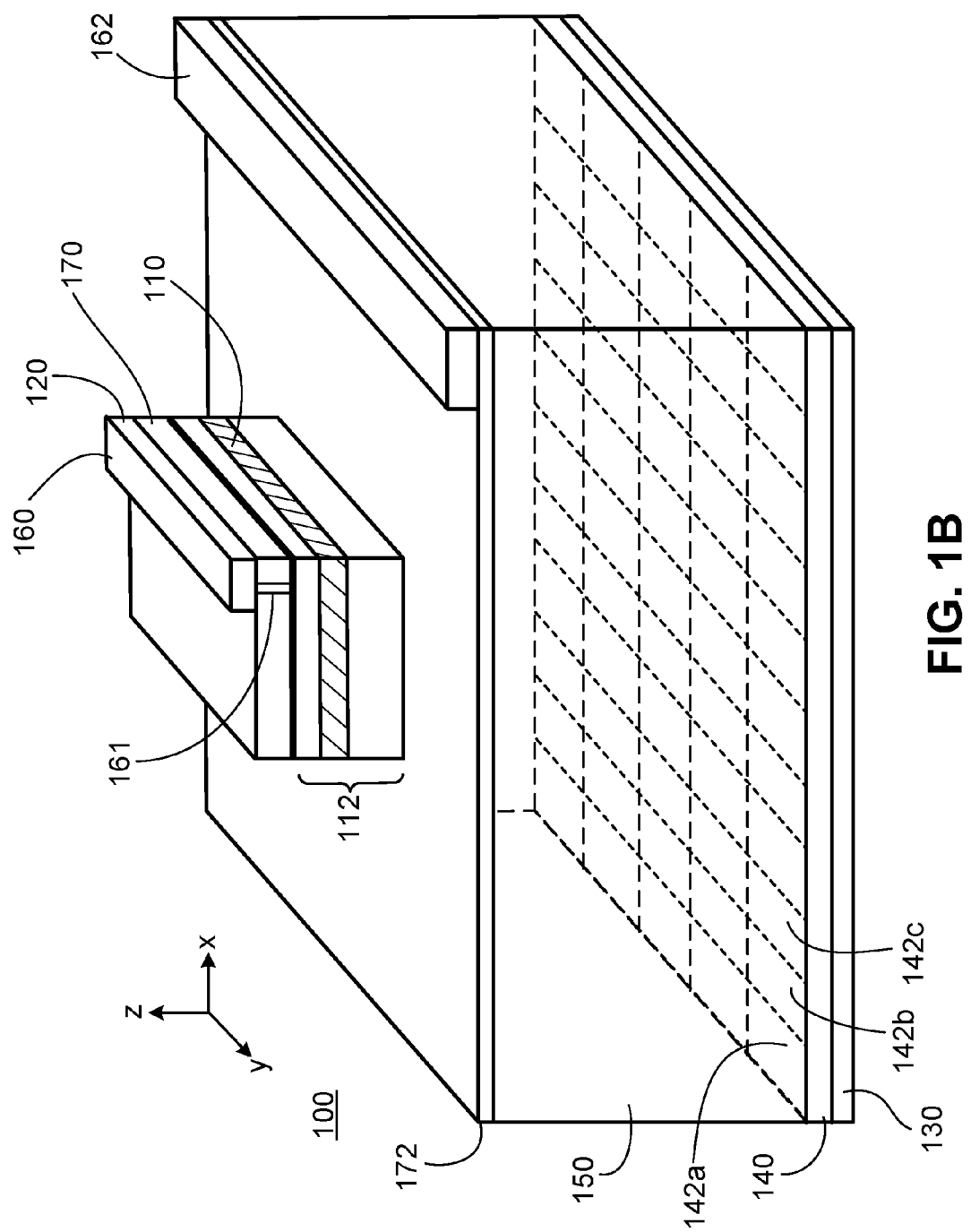
FIG. 1B shows a perspective view of the integrated laser device shown in FIG. 1A.

Referring to FIG. 1A and FIG. 1B, an exemplary integrated laser device 100 is shown in cross-section and perspective, respectively. Cartesian axes are shown for ease of reference. In this regard, an object's thickness refers to the object's dimension as measured along z-axis. An object's lateral area refers to the object's area in the x-y plane. "Top" and "bottom" refer to the +z and −z directions, respectively. For example, the top surface of device 100 refers to the surface facing in the +z direction, while the bottom surface refers to the opposite surface.

Device 100 includes a substrate layer 150 supporting, on its top surface, a light emitting module, and on its bottom surface a spatial light modulator (SLM) 140 and reflector 130. The light emitting module is an integrated device made up of a layer 112 that includes a gain medium 110, sandwiched between two electrodes and adjacent a reflector 120. Specifically, a first electrode 170 is positioned on the top surface of layer 112, while a second electrode 172 is positioned between the top surface of substrate layer 150 and the bottom surface of layer 110. First and second electrodes 170 and 172 are formed from an electrically conducting material that is substantially transparent to radiation at the laser wavelength. For example, Indium Tin Oxide can be used for visible wavelengths. Other transparent conductive oxides (TCOs), conductive polymers, metal grids, carbon nanotubes (CNT), graphene, nanowire meshes and ultra thin metal films, can also be used. Electrical contacts 160 and 162 provide electrical connections to electrodes 170 and 172, respectively. Electrical contact 160 is positioned on the upper surface of reflector 120 and is electrically connected to electrode 160 by a via 161.

More generally, other electrode structures are also possible. For example in some embodiments, the first and/or second electrodes can be formed from an electrically conductive material that is opaque at the operational wavelength. For instance, a metal conductor (e.g., aluminum, copper, gold), that can be opaque at visible and certain IR wavelengths, can be used. In such embodiments, the electrode layer can include an aperture for transmitting radiation.

A current source 180 is connected to electrical contacts 160 and 162. The current source is in communication with and under the control of a computer controller 190, which is also in communication with SLM 140.

Here, reflectors 120 and 140 on opposing sides of substrate layer 150 define an optical cavity, within which SLM 140 is arranged. During operation, current source 180 injects charge carriers into layer 112 by applying a voltage across electrodes 170 and 172. Recombination of electrons and holes in the layer emit radiation at the laser wavelength. At least some of the emitted photons traverse the optical cavity multiple times, being reflected by reflectors 120 and 140. Several radiation paths for this cavity radiation are depicted in FIG. 1A by double-headed arrows. This radiation is amplified by stimulated emission as it traverses the gain medium and diverges as it exits the light emitting module into substrate layer 150, spreading out to cover SLM 140.

Reflector 120 is a partial reflector, meaning that not substantially all incident radiation at the laser wavelength is reflected and some of the light is transmitted as laser output 199. For example, reflector 120 can transmit about 1% or more radiation incident at the laser wavelength. Reflector 120 can be a planar reflector, such as a metalized surface (e.g., silver or aluminum) or a multilayer reflector, such as a distributed Bragg reflector (DBR).

SLM 140 has multiple elements (pixels) arrayed in the x-y plane, each independently addressable. Four of these elements are labeled 142$a$, 142$b$, 142$c$, and 142$d$ in FIG. 1A. Generally, the array may include hundreds or thousands of elements in both the x- and y-directions and each may have an area of on the order of $10^2$-$10^4$ pmt. Typically, the elements have dimensions larger (e.g., 5X, 10X, or more) than the operational wavelength to reduce diffractive effects associated with periodic array structure.

Depending on the state of the corresponding SLM element, SLM 140 transmits a portion of incident radiation at the laser wavelength to reflector 130, which reflects the incident radiation back along the path along which it came. In other words, reflector 130, in this configuration, is not a planar specular reflector. Rather, reflector 130 can be a chirped grating with a structure configured to satisfy the Littrow condition for incident cavity radiation. Alternatively, or additionally, reflector 130 can be formed from multiple tiled gratings, each oriented with its periodic structure normal to the incidence plane of local cavity radiation. Other reflectors are also possible, such as, for example, a structured interface composed of a mirror array, each mirror arranged to be normal to local cavity radiation. Retroreflective sheeting can also be used.

During operation, computer controller 190 drives SLM 140 with control signals to vary the amount of cavity radiation transmitted by each SLM element. As a result, the intensity of the cavity radiation varies laterally across the cavity, with relatively low radiation intensity regions corresponding to SLM elements set to transmit relatively low amounts of incident cavity radiation, while those regions corresponding to high transmission SLM elements having relatively high intensity. Intermediate intensity levels result from intermediate transmission at the SLM. The resulting emission 199 from the top surface of device 100 shares the same intensity profile as the cavity radiation. Accordingly, the system can control and vary the intensity profile of laser radiation emitted from the device with a resolution and intensity grey levels corresponding to the resolution and number of levels of transmission of the SLM. Moreover, the profile can be varied at the modulation rate of the SLM (e.g., 100 Hz or more, up to 1 kHz or more).

A variety of transmissive SLM technologies can be used for SLM 140. For example, liquid crystal (LC) SLMs can be used. Examples of LC SLMs include nematic phase LC SLMs and ferroelectric LC SLMs. Typically, LC SLMs modulate light by controlling the amount transmitted by the SLM or by controlling the phase of polarized light transmitted. Linear polarizers may be used to absorb light of a particular polarization state, and the about of light having that state is controlled by a LC cell. More generally, SLMs based on other materials that provide an electro-optic response can be used. SLMs that selectively introduce phase changes to radiation using the Kerr effect can also be used. SLMs based on crystalline materials, e.g., using the Pockels effect, can be used also. Lithium Niobate, for example, is a commonly used electrooptic crystal. In some embodiments, polymer-based electro-optic materials are used to provide the electro-optic effect in the SLM, such as materials in which nonlinear optical chromophores are arranged in a polymer lattice.

Furthermore, layer 112 can, in general, have a variety of component layers that provide optical gain. For example, in some embodiments, gain medium 110 is in the form of a quantum well or multiple quantum well structure. Generally, a quantum well is a thin layer which can confine (quasi-) particles (typically electrons or holes) in the dimension perpendicular to the layer surface, whereas the movement in the other dimensions is not restricted.

A quantum well can be formed, for example, from a thin layer of a semiconductor medium, embedded between other semiconductor layers of wider bandgap (e.g., GaAs quantum well embedded in AlGaAs, or InGaAs in GaAs). The thickness of such a quantum well is typically ≈2-20 nm. Such thin layers can be fabricated with molecular beam epitaxy (MBE) or metal-organic chemical vapor deposition (MOCVD). In some embodiments, liquid phase epitaxy can be used to form quantum well layers, such as for example, where thicker quantum well layers are desired (e.g., 20 nm or thicker). Both electrons and holes can be confined in semiconductor quantum wells.

In certain embodiments, layer 112 includes a p-n junction forming an emission area, such as a homojunction or heterojunction structure. A homojunction refers to the junction formed between one layer of a p-type semiconductor adjacent a layer of a n-type semiconductor. Heterostructures are formed where the p-n junction is formed from more than one type of semiconductor, usually with adjacent p-n type semiconductors having a low bandgap between layers of another semiconductor material having a high bandgap.

In some embodiments, layer 112 can include quantum dot or quantum dash structures for facilitating stimulated radiation emission. Typically, quantum dots are very small semiconductor particles (e.g., having dimensions on the order of several nanometers). The radiation emission properties of quantum dots can vary depending on the size and composition of the dots. A quantum dash refers to an elongate nanostructure (e.g., the size of a quantum dot in two dimensions but much longer in the third dimension, such as 100's of nm).

Substrate layer 150 is formed from a material that is substantially transparent to the laser wavelength, has sufficient mechanical strength to support the other components of device 100, and has mechanical and chemical properties compatible with the techniques used to manufacture device 100. In some embodiments, substrate layer 150 is formed from silicon (e.g., crystalline, polycrystalline, or amorphous silicon). Silicon is substantially transparent to infrared light with wavelengths above about 1.1 microns, for example. In some implementations, substrate layer 150 is formed from a material substantially transparent to optical wavelengths, such as glass or plastics commonly used in for liquid crystal displays.

The thickness of substrate layer 150 is selected based on the divergence of the cavity radiation exiting the light emitting module and the size of SLM 140. Generally, substrate layer 150 is sufficiently thick so that substantially the entire area of the SLM is illuminated (or at least, for a circular beam cross-section, the beam diameter at the SLM is approximately equal to the lateral dimension of the SLM). For example, a substrate layer thickness of approximately 2 cm is need to provide sufficient beam divergence to cover a 1 cm×1 cm SLM for a conical beam with a divergence cone angle of about 15°. Thinner substrate layers can be used for smaller SLMs and/or for higher beam divergence. Conversely, for larger SLMs and/or lower beam divergence, thicker substrate layers may be necessary.

In general, integrated laser device 100 can be implemented for a variety of different wavelengths. Implementations at UV (e.g., 200 nm to 380 nm), visible (380 nm to 780 nm), and IR (780 nm to 2,000 nm or more) wavelengths are possible. In each case, component materials of the device are selected to have the requisite functionality at the selected operational wavelength. For instance, InGaAsP can be used for operational wavelengths of about 1,550 nm. As another example, AlGaInN can be used for operational wavelengths in a range of about 200 nm to 550 nm, and AlInGaP can be used for operational wavelengths in a range of about 550 nm to 700 nm.

Although device 100 is depicted in FIGS. 1A and 1B as having a transmissive SLM 140 and a reflector 130 on the bottom side of substrate layer 150, other configurations are also possible. For example, in some embodiments, the function of SLM 140 and reflector 130 can be combined in a single layer, such as in a reflective SLM. Examples of reflective SLM's include micro-electromechanical system (MEMS) SLMs, such as micromirror arrays (MMAs). Reflective LC SLMs, such as liquid crystal on silicon (LCoS) SLMs, are also possible.

Moreover, while reflector 120 is configured as a partial reflector in device 100, resulting in emission 199 in the z-direction, emission in the negative z-direction is also possible. For example, in some implementations, device 100 can be configured so SLM 140 and reflector 130 partially transmit laser radiation. In such cases, reflector 120 can reflect substantially all incident laser radiation, eliminating emission from that side of device 100.

Figure 2:
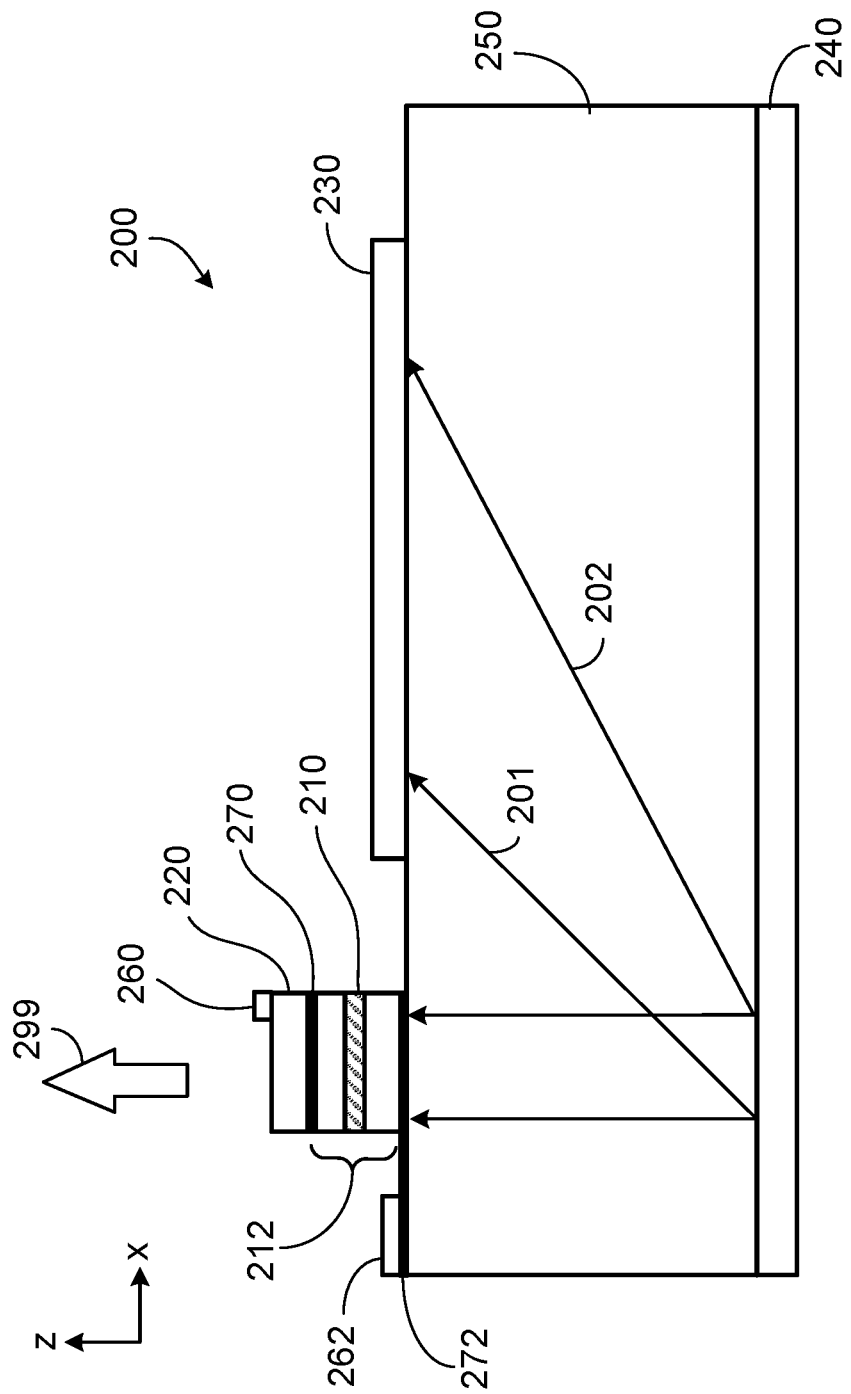
FIG. 2 shows a cross-sectional view a second embodiment of an integrated laser device.

Furthermore, while SLM 140 and the light emitting module are located on opposing sides of substrate layer 150 in device 100, architectures in which the SLM is arranged on the same side of the substrate as the light emitting module are also possible. For example, referring to FIG. 2, an integrated laser device 200 includes a substrate layer 250 which supports a light emitting module and a SLM 230 on the same side.

Here, the light emitting module includes a layer 212 with a gain medium 210 sandwiched between electrode layers 270 and 272. Electrode layer 272 is positioned adjacent a top surface of substrate layer 250. Electrode layer 270 is positioned between layer 212 and a top reflector 220. Top reflector 220 is a partial reflector for radiation at the laser wavelength, serving as an output coupler for device 200. An electrical contact 260 for electrode layer 270 is positioned on the top surface of reflector 220, being electrically connected to electrode layer 270 by a via (not shown). Electrode layer 272 extends laterally on the top surface of substrate layer 250 beyond the light emitting module, providing an exposed area on which an electrical contact 262 is formed. The light emitting module operates the same way as described for the light emitting module of laser device 100 above.

A second reflector 240 is formed on the bottom surface of substrate layer 250 and a reflective SLM 230 (e.g., MMA or LCoS SLM) is positioned next to the light emitting module on the top surface. During operation, cavity light from the light emitting module traverses substrate layer 250 downwards, reflects from second reflector 240, and traverses substrate layer 250 a second time to SLM 230. This double-pass path through substrate layer 250 is retraced from SLM 230 back to the light emitting module. Rays 201 and 202 illustrate this in FIG. 2.

A variety of types of reflector can be used for reflector 240. For example, reflector 240 can include a grating designed to diffract incident cavity radiation so that a low order (e.g., zero order, first order) diffraction maximum are directed toward corresponding locations on SLM 230. Alternatively, reflector 240 can include a blazed surface that includes facets coated with a reflective material (e.g., a reflective metal) such that incident cavity radiation is reflected toward corresponding locations on SLM 230.

While SLM 230 is depicted as a reflective SLM, in some embodiments, a transmissive SLM in combination with a further reflector can be used, as illustrated for laser device 100 shown in FIG. 1.

Having one surface of substrate layer support both the light emitting module and the SLM may be advantageous because such arrangements may be simpler to manufacture compared to devices that have complex components on opposing sides of the substrate layer. Alternatively, or additionally, the architecture of device 200 may facilitate use of thinner devices compared to device 100 because the double pass of cavity radiation through substrate layer 250 can allow thinner substrate layers to be used while still allowing sufficient divergence of the cavity radiation before reflecting from the SLM.

Figure 3:
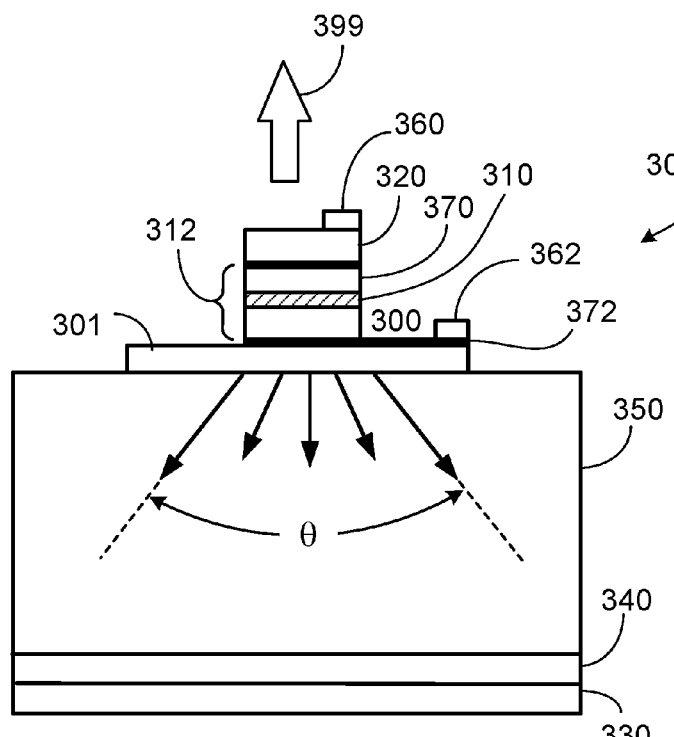
FIG. 3 shows a cross-sectional view of a third embodiment of an integrated laser device.

In general, laser devices can include additional components integrated into the structure. For example, referring to FIG. 3, an integrated laser device 300 includes a diverging optical layer 301 between the light emitting module and a substrate layer 350. The remaining structure is similar to the structure of device 100. Specifically, the light emitting module of device 300 includes a layer 312 containing gain medium 310 sandwiched between electrodes 370 and 372, and a reflector 320. Electrical contacts 360 and 362 are in electrically connected to electrodes 370 and 372, respectively. A SLM 340 and reflector 330 are positioned on the bottom surface of substrate layer 350, opposite the light emitting module and diverging optical layer 301.

Diverging optical layer 301 operates to increase angular divergence of light the radiation at the laser wavelength exiting emitting module into substrate layer 350 and, conversely, reducing angular divergence of radiation at the laser wavelength exiting substrate layer 350 and entering the light emitting module. Diverging optical layer 301 can be a diffractive layer or a refractive layer, for example. For example, diverging optical layer 301 can include diffractive structures (e.g., a one or two-dimensional grating) designed to diffract the radiation as it traverses the layer. A chirped grating, for example, can be used. Alternatively, in some embodiments, diverging optical layer 301 can include refractive structures (e.g., curved or faceted interfaces between two media having differing refractive indexes at the laser wavelength) which refract incident radiation to increase/decrease divergence.

Use of a diverging optical layer as part of device 300 can facilitate using SLMs that have relatively larger lateral area with a substrate layer that is relatively thin.

Alternatively, or in addition to a diverging optical layer, other components can also be included. For example, a further partial reflector (e.g., a partial DBR) can be included on the substrate-side of gain medium 310 (e.g., where diverging optical layer 301 is positioned in device 300). Including (at least partial) reflectors on both sides of the gain medium can ensure at least some optical feedback and emission laterally across the device independent of the controlled SLM influence.

Figure 4:
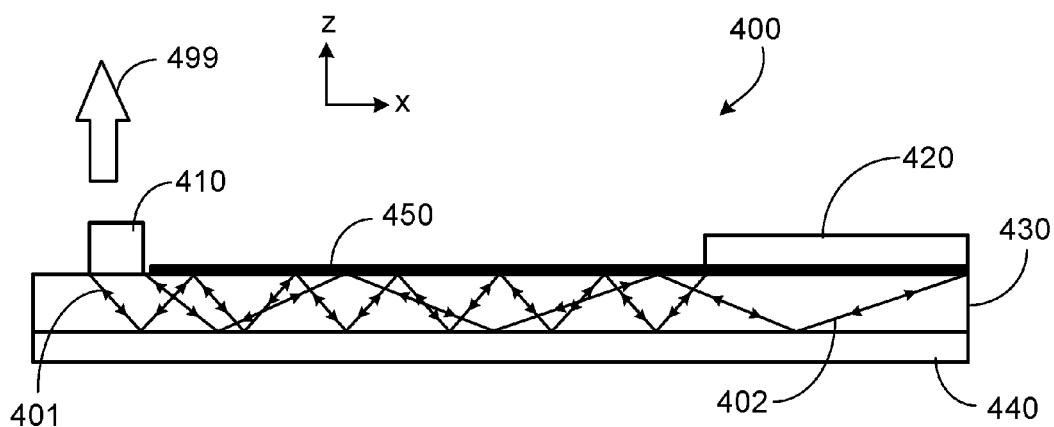
FIG. 4 shows a cross-sectional view of a fourth embodiment of an integrated laser device.

While a diverging optical layer can be used to reduce the thickness of substrate layer and maintain sufficient divergence of light from the light emitting module to use a SLM that has a larger lateral area than the light emitting module, other techniques for reducing device thickness are also possible. For instance, in some embodiments, it is possible to fold the optical path of radiation in substrate layer to ensure adequate path length to illuminate the entire lateral area of the SLM using a very thin substrate layer. Referring to FIG. 4, for example, an integrated laser device 400 includes a thin substrate layer 430 which supports a light emitting module 410 and a reflective SLM 420 (e.g., a MMA or LCoS SLM) both on the top surface of the substrate layer. Reflective layers 440 and 450 (e.g., metallized reflectors) are disposed on the bottom and top surfaces of substrate layer 430, respectively.

Cavity radiation, exemplified by rays 401 and 402, are launched from light emitting module 410 into substrate layer 430. The cavity light reflects multiple times from the top and bottom reflective layers, diverging, as it is guided in the substrate layer to SLM 420. SLM 420 modulates the beam and directs it back along the same path to light emitting module 410. In some embodiments, reflective SLM 420 can be replaced by a transmissive SLM and a reflector.

A coupling layer (e.g., a grating) can be used to provide directional coupling from light emitting module 410 into substrate layer 430.

In some implementations, total internal reflection, rather than reflective layers, can be used to confine and guide cavity radiation in substrate layer 430.

Using such architectures, particularly thin substrate layers can be used with relatively large SLMs. For example, substrate layers of 0.25 cm or less (e.g, 0.1 cm or less, 0.05 cm or less) can be used in conjunction with SLMs that have an area of 1 cm$^2$ or more (e.g., 2 cm$^2$ or more, 3 cm$^2$ or more, 4 cm$^2$ or more).

In general, further alternatives are also possible. For example, while the foregoing examples feature pixelation on the SLM, additional components can also be pixelated to provide further levels of variability to the device. For instance, in some implementations one or both of the electrodes for injecting carriers into the gain medium can be pixelated yielding local current density variation to vary spatial gain in gain medium. Such implementations can be advantageous because it can provide additional levels of intensity control in the laser output of the device.

In some embodiments, the entire light emitting module can be constructed as a pixelated array.

Other configurations are also possible. In some implementations, the light emitting module can be configured as a ridge laser (e.g., defining an optical cavity in the y-direction) and the SLM can be configured to spatially vary second order emission from the device in the z-direction. For example, a ridge laser can be used with a second-order grating (e.g., a grating structure to out couple light in a direction substantially perpendicular to the waveguide surface and into the substrate layer). Second-order gratings can be formed from a periodic dielectric structure on the upper or lower ridge surface or from corrugated ridge sidewalls or top surface, for example.

Moreover, while the foregoing implementations use electrical pumping to achieve a population inversion in the gain medium, in other implementations different pumping schemes can be utilized. For instance, optical pumping or electron-beam pumping can be used.

In general, the integrated laser devices described above can be manufactured using techniques commonly used in semiconductor device manufacturing, specifically wafer or LCD processing techniques. For example, the component portions of integrated laser devices can be formed by sequentially depositing layers of material onto a substrate layer and patterning each layer as necessary. Layer deposition can be performed using a variety of techniques, depending on the nature of the layer being formed (e.g., the material, thickness, crystallinity, etc.) and the nature of the underlying surface on which the layer is formed. Exemplary deposition techniques include physical vapor deposition (PVD), chemical vapor deposition (CVD), electrochemical deposition (ECD), molecular beam epitaxy (MBE) and atomic layer deposition (ALD).

Layer patterning is commonly performed using lithographic techniques, in which a pattern is transferred to a resist layer and a subsequent etch step transfers the pattern from the resist layer to an overlying or underlying layer of material. The initial patterning of the resist layer can be performed using photolithography or imprint lithography, for example. Wet, dry, and/or plasma etching can be used to remove material. Polishing processes (e.g., chemical mechanical polishing) can be used to planarize exposed surfaces.

In some cases, the light emitting module can be formed on one substrate and the SLM formed on a second substrate. The two substrates are then bonded together to provide the integrated laser devices.

In some embodiments, the light emitting module can be formed in one manufacturing process, while the SLM is produced in a second, separate process. The two components are then bonded to a common substrate layer to provide the integrated laser device. Such approaches may be desirable where particularly thick substrate layers are needed (e.g., where the substrate layer is 1 cm or more thick, such as 2 cm or more, up to about 5 cm). Such approaches may also be desirable where the two components are bonded on the same side of a common substrate layer, and/or where different components are manufactured by different vendors.

Wafer processing techniques can also be used to form multiple devices on a single wafer, which is then diced to yield individual laser devices.

The integrated laser devices may be further packaged to provide a robust component that can be readily integrated into larger systems, e.g., by integration onto printed circuit boards. Chip packaging techniques conventionally used for packaging integrated circuits, LEDs, and diode lasers can be used.

Figure 5:
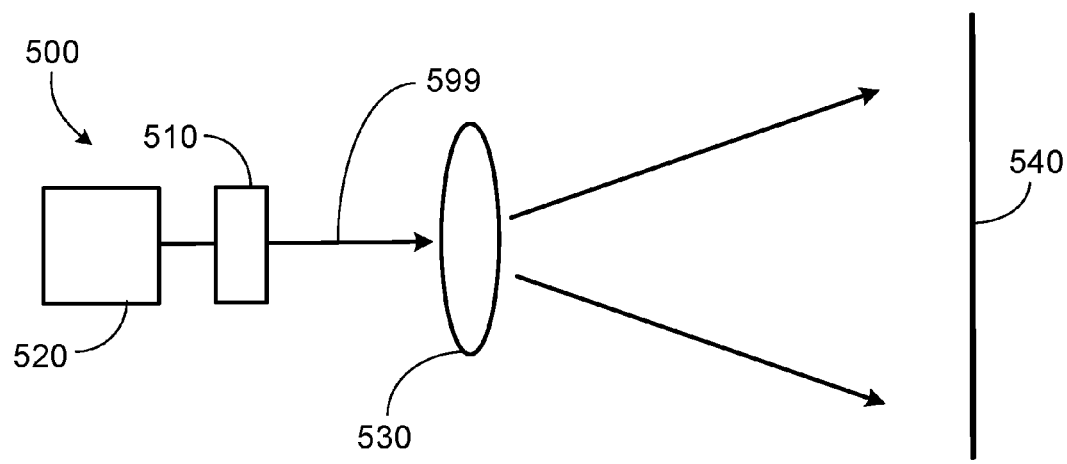
FIG. 5 shows a schematic of a display device that incorporates an integrated laser device.

In general, the integrated laser devices described above can be used in a variety of applications in which radiation having a spatially varying intensity profile is desired. For example, integrated laser devices can be used in display applications. Referring to FIG. 5, an exemplary display system 500 includes an integrated laser device module 510, a control module, and an optical projection module 530. Laser device module 510 includes one or more integrated laser devices, such as those described above. For example, laser device module 510 can include multiple laser devices each configured to emit modulated light having a different color (e.g., red, green, blue and/or cyan, magenta, turquoise emitters). Alternatively, or additionally, laser device module can include multiple integrated laser devices each having the same color that are tiled together to yield a display that has greater resolution than each individual laser device (in which the resolution corresponds to the resolution of the SLM).

During operation, control module 520, which includes a display driver, delivers signals to laser device module 510 causing the laser devices to emit modulated light 599 containing image information to optical projection module 530. Optical projection module 530 includes projection optics (e.g., lenses, mirrors, and/or diffractive optical elements) which form an image from modulated light 599 on a screen 540.

Figure 6:
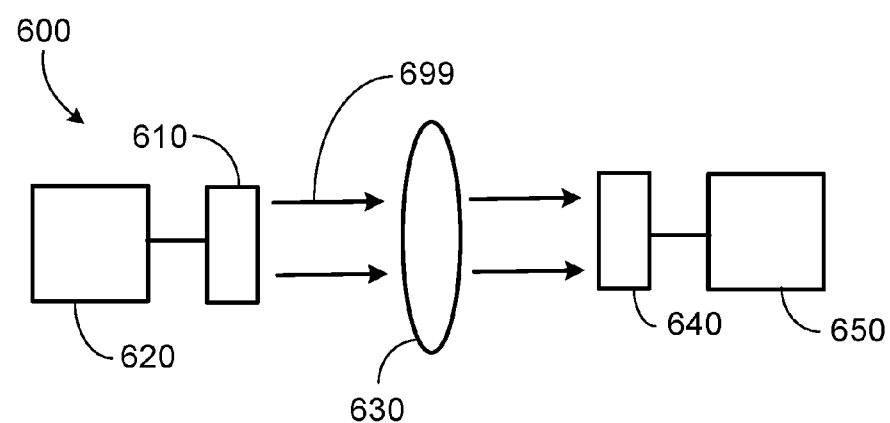
FIG. 6 shows a schematic of an optical communication system that incorporates an integrated laser device.

As another example, integrated laser devices can be used in optical communications applications. Referring to FIG. 6, for example, an optical communications system 600 includes an integrated laser device module 610, a control module 620, a relay optical module 630, a detection module 640, and a signal receiving module 650.

During operation, control module 620 delivers signals to laser device module 610, causing the laser devices in module 610 to emit modulated light 699 encoded with information. Relay optical module 630 receives the modulated light and directs it to detection module 640. The pixelated sensor(s) in detection module 640 monitor the modulation pattern of the light and send corresponding signals containing the encoded information to signal receiving module 650. The signal receiving module 650 then decodes the information.

In general, communications system 600 can include free space optics, waveguide optics, and/or integrated optical components. For example, relay optical module 630 can include free space components which form a far field image of the modulated emission profile from one or more laser devices in laser device module 610 on a sensor (or multiple sensors) in detection module 640.

Due to the spatial encoding of information into the profile of modulated light 699, communications system 600 can convey large amounts of information simultaneously to detection module 640, even with relatively low modulation rates of modulated light 699.

Some aspects of the integrated laser devices and systems containing these devices described here can be implemented in digital electronic circuitry, or in computer software, firmware, or hardware, including the structures disclosed in this specification and their structural equivalents, or in combinations of one or more of them. For example, in some implementations, the computer controller 190 can be implemented using digital electronic circuitry, or in computer software, firmware, or hardware, or in combinations of one or more of them.

The term "computer controller" encompasses all kinds of apparatus, devices, and machines for processing data and/or control signal generation, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

Some of the processes described above can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and processors of any kind of digital computer. Generally, a processor will receive instructions and data from a read only memory or a random access memory or both. A computer includes a processor for performing actions in accordance with instructions and one or more memory devices for storing instructions and data. A computer may also include, or be operatively coupled to receive data from or transfer data to, or both, one or more mass storage devices for storing data, e.g., magnetic, magneto optical disks, or optical disks. However, a computer need not have such devices. Devices suitable for storing computer program instructions and data include all forms of non-volatile memory, media and memory devices, including by way of example semiconductor memory devices (e.g., EPROM, EEPROM, flash memory devices, and others), magnetic disks (e.g., internal hard disks, removable disks, and others), magneto optical disks, and CD ROM and DVD-ROM disks. The processor and the memory can be supplemented by, or incorporated in, special purpose logic circuitry.

To provide for interaction with a user, operations can be implemented on a computer having a display device (e.g., a monitor, or another type of display device) for displaying information to the user and a keyboard and a pointing device (e.g., a mouse, a trackball, a tablet, a touch sensitive screen, or another type of pointing device) by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

A computing system may include a single computing device, or multiple computers that operate in proximity or generally remote from each other and typically interact through a communication network. Examples of communication networks include a local area network ("LAN") and a wide area network ("WAN"), an inter-network (e.g., the Internet), a network comprising a satellite link, and peer-to-peer networks (e.g., ad hoc peer-to-peer networks). A relationship of client and server may arise by virtue of computer programs running on the respective computers and having a client-server relationship to each other.

Figure 7:
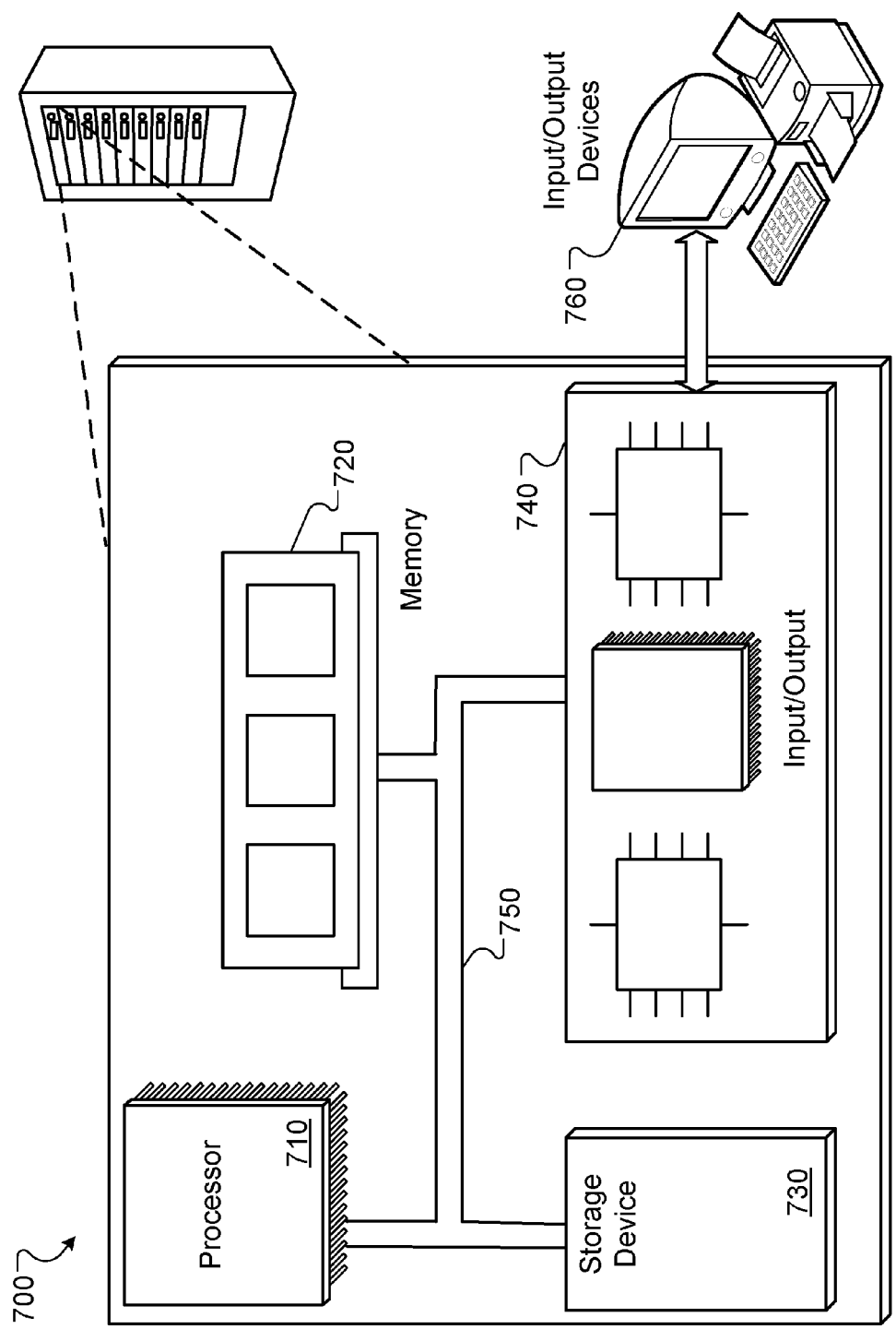
FIG. 7 shows an example computer system for controlling an integrated laser device.

FIG. 7 shows an example computing system 700 that includes a processor 710, a memory 720, a storage device 730 and an input/output device 740. Each of the components 710, 720, 730 and 740 can be interconnected, for example, by a system bus 750. The processor 710 is capable of processing instructions for execution within the system 700. In some implementations, the processor 710 is a single-threaded processor, a multi-threaded processor, or another type of processor. The processor 710 is capable of processing instructions stored in the memory 720 or on the storage device 730. The memory 720 and the storage device 730 can store information within the system 700.

The input/output device 740 provides input/output operations for the system 700. In some implementations, the input/output device 740 can include one or more of a network interface devices, e.g., an Ethernet card, a serial communication device, e.g., an RS-232 port, and/or a wireless interface device, e.g., an 802.11 card, a 3G wireless modem, a 4G wireless modem, etc. In some implementations, the input/output device can include driver devices configured to receive input data and send output data to other input/output devices, e.g., keyboard, printer and display devices 760. In some implementations, mobile computing devices, mobile communication devices, and other devices can be used.

A number of embodiments have been described. Nevertheless, it will be understood that various modifications may be made without departing from the spirit and scope of the invention. Accordingly, other embodiments are within the scope of the claims.

What is claimed is:

1. A laser device with variable transverse spatial mode output, comprising:
   a substrate formed from a material transparent at a laser wavelength;

a first reflecting layer supported by the substrate, the first reflecting layer being configured to reflect at least some incident radiation at the laser wavelength;

a layer comprising a gain medium for providing stimulated emission of radiation at the laser wavelength, the layer comprising the gain medium being positioned between the first reflecting layer and the substrate;

a second reflecting layer supported by the substrate on an opposite side of the substrate from the first reflecting layer, the second reflecting layer being configured to reflect at least some incident radiation at the laser wavelength;

a spatial light modulator supported by the substrate and positioned in a path of radiation in an optical cavity comprising by the first and second reflecting layers, the spatial light modulator comprising an array of elements each corresponding to a different path for radiation in the optical cavity; and a computer controller in communication with the spatial light modulator, wherein during operation the computer controller causes the spatial light modulator to selectively vary an intensity or phase of radiation in each of the radiation paths in the optical cavity to provide variable transverse spatial mode output of the radiation from the laser device.

2. The laser device of claim 1, wherein the spatial light modulator is on the opposite side of the substrate as the layer comprising the gain medium.

3. The laser device of claim 2, wherein the spatial light modulator is a transmissive spatial light modulator.

4. The laser device of claim 1, wherein the spatial light modulator is on the same side of the substrate as the layer comprising the gain medium.

5. The laser device of claim 4, wherein the spatial light modulator is a reflective spatial light modulator.

6. The laser device of claim 4, wherein the second reflecting layer is arranged to reflect incident radiation emitted by the gain medium toward the spatial light modulator and to reflect incident radiation reflected by the spatial light modulator toward the gain medium.

7. The laser device of claim 1, wherein the first reflecting layer comprises a Bragg reflector for radiation at the laser wavelength.

8. The laser device of claim 1, wherein the second reflecting layer comprises a reflective grating.

9. The laser device of claim 8, wherein the reflective grating is a chirped grating.

10. The laser device of claim 1, wherein the gain medium comprises a quantum well layer.

11. The laser device of claim 1, further comprising a first electrode layer between the layer comprising the gain medium and the substrate.

12. The laser device of claim 11, further comprising a second electrode layer, the first and second electrode layers being on opposing sides of the layer comprising the gain medium.

13. The laser device of claim 11, wherein one or both of the first and second electrode layers are patterned electrode layers.

14. The laser device of claim 11, wherein the first electrode layer is formed from an electrically-conductive material transparent at the laser wavelength.

15. The laser device of claim 11, wherein the first electrode layer comprises an aperture for the passage of laser radiation.

16. The laser device of claim 1, wherein the first or second reflecting layer is a partial reflecting layer for radiation at the laser wavelength.

17. The laser device of claim 1, wherein the laser wavelength is in a range from 250 nm to 5,000 nm.

18. The laser device of claim 1, wherein, during operation, the gain medium is electrically-pumped, optically-pumped, or pumped using an electron beam.

19. A display comprising the laser device of claim 1.

20. An optical communication system comprising the laser device of claim 1.

21. A method of forming a laser device, comprising:
    forming a light emitting module comprising a first reflecting layer and a layer comprising a gain medium, the first reflecting layer being configured to reflect at least some incident radiation at a laser wavelength and the layer comprising the gain medium being configured to provide stimulated emission of radiation at the laser wavelength;
    forming a spatial light modulator; and
    assembling the laser device by attaching the light emitting module and spatial light modulator to a common substrate layer formed from a material transparent at the laser wavelength such that the spatial light modulator is positioned in a path of radiation in an optical cavity defined by the first reflecting layer and a second reflector, the spatial light modulator comprising an array of elements each corresponding to a different path for radiation through the substrate layer in the optical cavity.

22. The method of claim 21, wherein forming the light emitting module comprises sequentially forming multiple layers on top of each other and patterning at least some of the layers.

23. The method of claim 21, wherein forming the laser device comprises forming multiple devices using a common substrate and dicing the substrate to provide multiple individual devices.

24. The method of claim 21, wherein the spatial light modulator comprises the second reflector.

25. The method of claim 21, wherein the second reflector is a second reflector layer and the spatial light modulator is a transmissive spatial light modulator and a path of the laser radiation between the first and second reflecting layers.

26. The method of claim 21, wherein the spatial light modulator and light emitting module are disposed on opposing sides of the common substrate.

27. The method of claim 21, wherein the spatial light modulator and light emitting module are disposed on the same side of the common substrate and an additional reflector is disposed on the opposite side of the substrate and arranged to direct light from the light emitting module to the spatial light modulator and vice versa.

* * * * *